United States Patent [19]

Shizawa

[11] Patent Number: 5,117,234
[45] Date of Patent: May 26, 1992

[54] SIGNAL MODULATION SYSTEM
[75] Inventor: Hiroshi Shizawa, Yokohama, Japan
[73] Assignee: Texas Instruments Incorporated, Dallas, Tex.
[21] Appl. No.: 616,169
[22] Filed: Nov. 20, 1990
[30] Foreign Application Priority Data Nov. 24, 1989 [JP] Japan .................................. 1-305860

[51] Int. Cl.⁵ .............................................. H03M 3/02
[52] U.S. Cl. ..................................... 341/143; 341/76; 375/27
[58] Field of Search ..................... 341/51, 55, 76, 77, 341/143; 375/27, 28, 30, 31; 381/31, 32, 33

[56] References Cited

U.S. PATENT DOCUMENTS

| 4,206,447 | 6/1980 | Ching et al. | 341/51 |
| 4,437,087 | 3/1984 | Petr | 341/51 |
| 4,475,227 | 10/1984 | Belfield | 341/51 |
| 4,518,950 | 5/1985 | Petr | 341/51 |
| 4,571,737 | 2/1986 | Nishitani et al. | 375/27 |
| 4,592,070 | 5/1986 | Chow et al. | 375/27 |
| 4,677,423 | 6/1987 | Benvenuto et al. | 341/51 |
| 4,862,173 | 8/1989 | Nishitani | 341/51 X |

Primary Examiner—Howard L. Williams
Attorney, Agent, or Firm—William E. Hiller; Richard L. Donaldson

[57] ABSTRACT

A signal modulation system for converting a plural-bit digital input signal to an encoded-bit digital output signal representative of an analog signal having a variable amplitude by employing delta-sigma modulation. The signal modulation system has a quantizer which quantizes the digital input signal and outputs it as the prescribed encoded digital ouput signal, and a control circuit portion which makes the quantizing step width in the quantizer vary corresponding to a control signal indicative of the amplitude of the analog signal to be represented. The quantizing step width is determined by a selection of respective sets of threshold values and quantizing values from memory as determined by the control signal. Comparators then produce comparison results between the digital input signal and each of the threshold values in the selected set, and a selector then selects one quantizing value in the selected set of quantizing values based upon the comparison results.

5 Claims, 13 Drawing Sheets

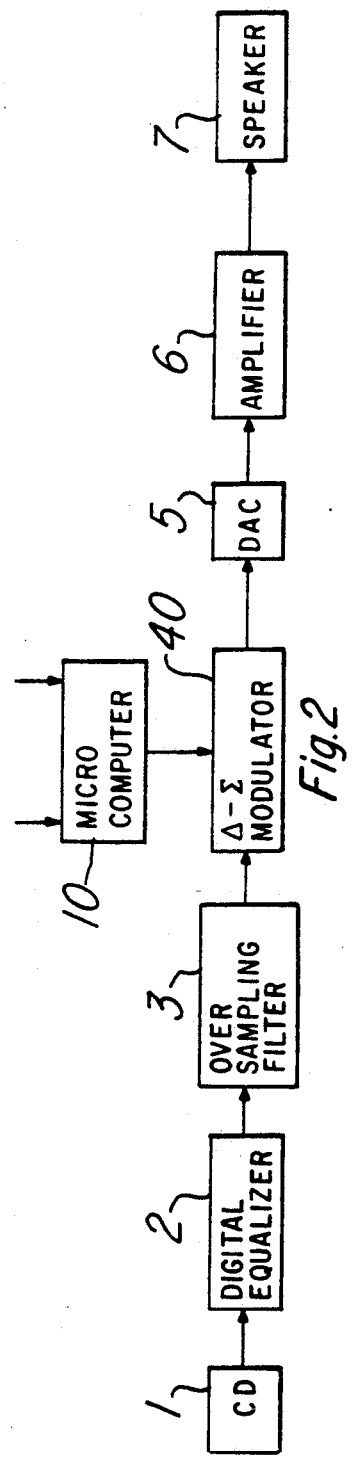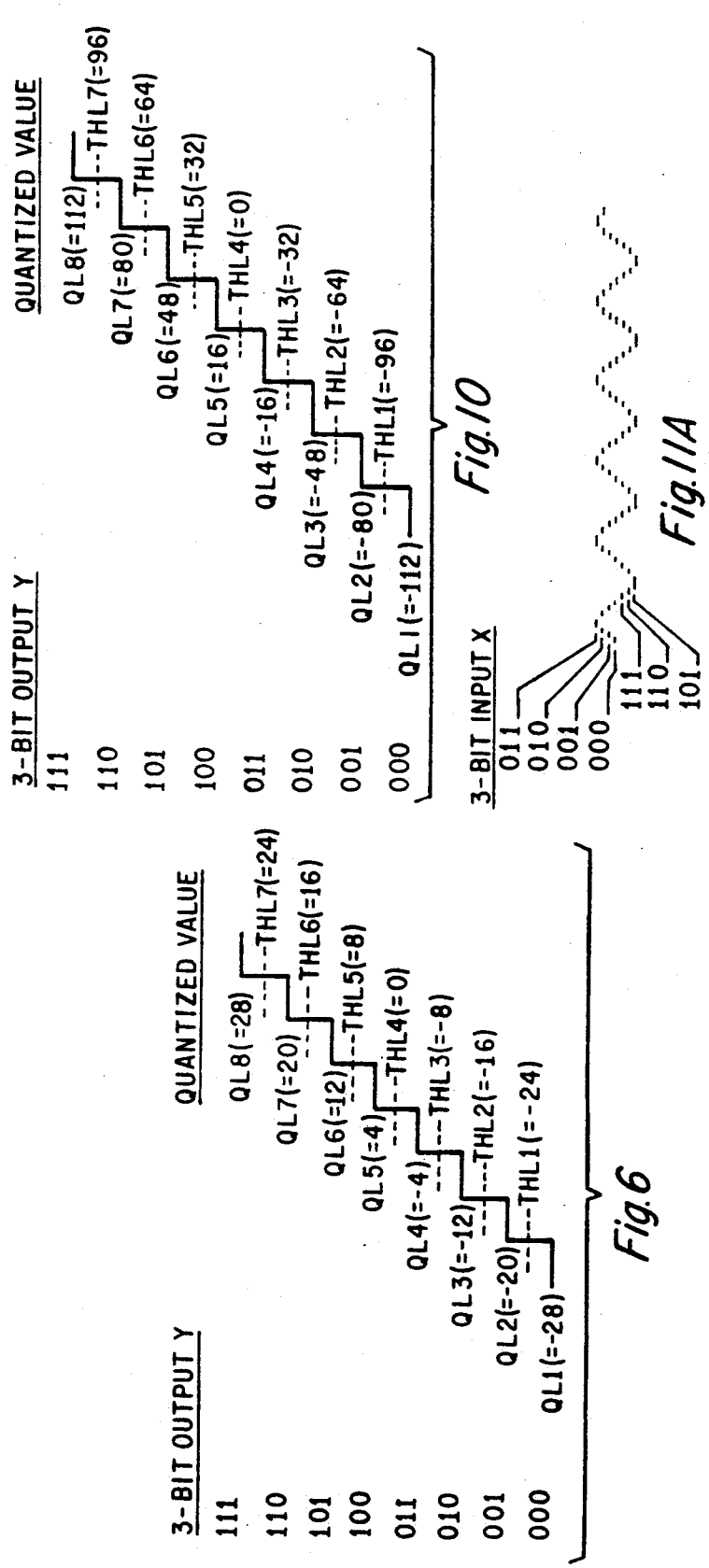

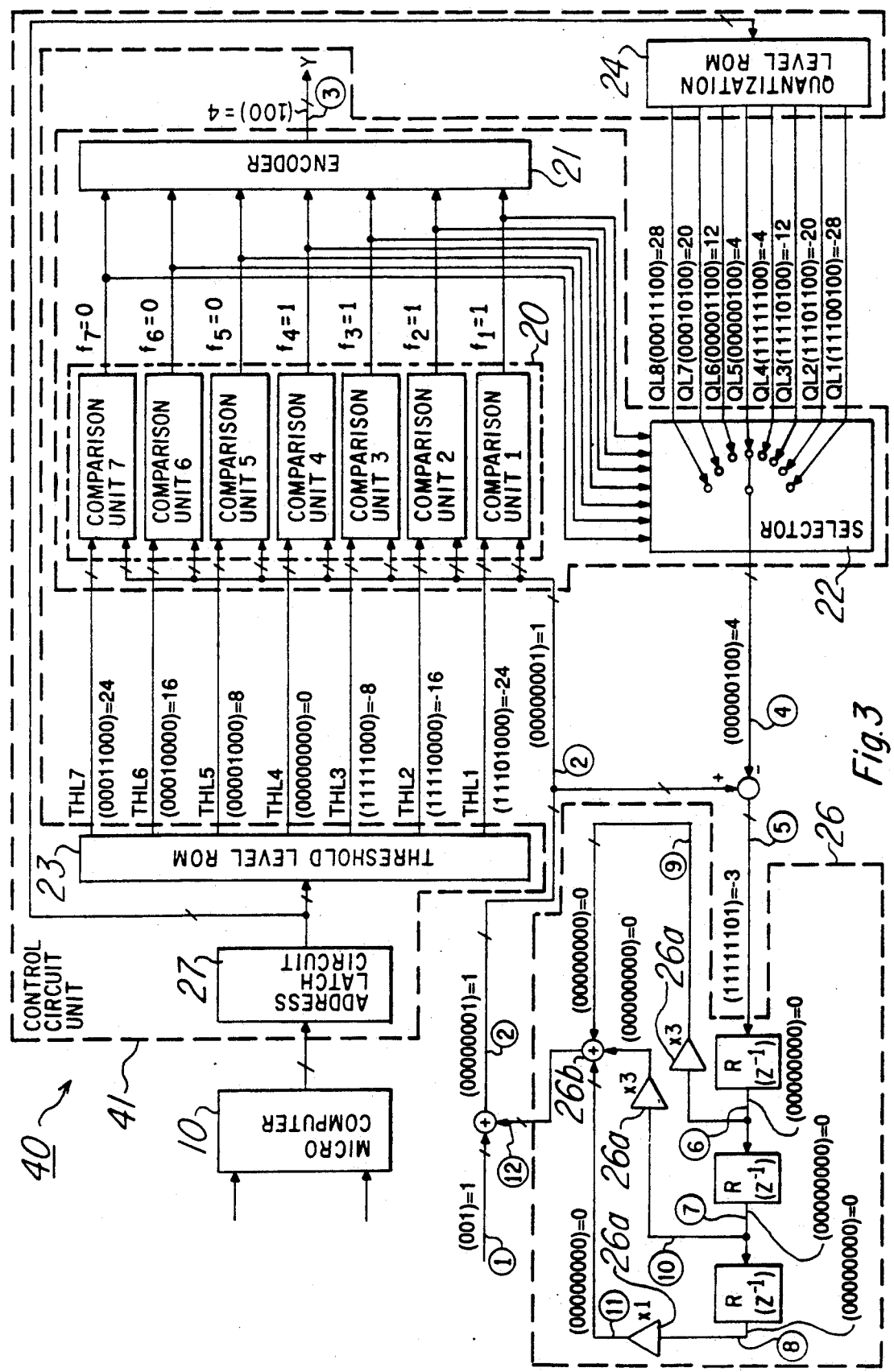

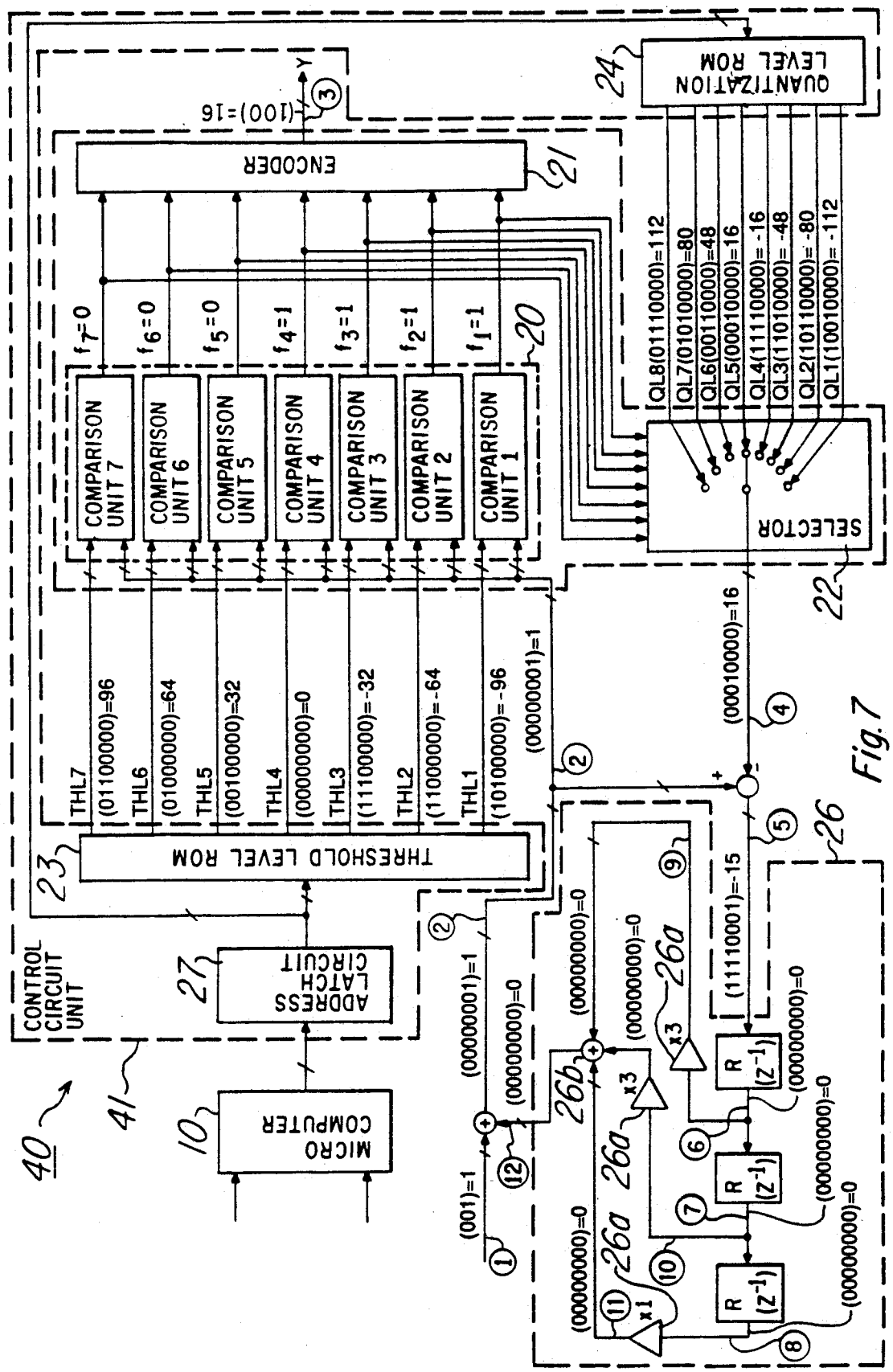

SIGNAL MODULATION SYSTEM

BACKGROUND OF THE INVENTION

1. Field of the Invention

This invention relates to a signal modulation system of the type for converting a plural-bit digital input signal to an encoded-bit digital output signal representative of an analog signal having a variable amplitude, and more particularly to such a signal modulation system employing the delta-sigma modulation technique.

2. Description of the Prior Art

Recently, much attention has been put on the AD (analog-digital) and DA (digital-analog) conversion technique known as the so-called $\Delta - \Sigma$ (delta-sigma) modulation method suitable for audio measurement, etc. This technique adopts the oversampling method, and obtains a sufficiently large dynamic range in the low-frequency range (such as the frequency range about 20 KHz audible to humans) by exploiting the fact that the spectral distribution of the quantization noise is concentrated in the high-frequency range. The aforementioned $\Delta - \Sigma$ modulation method is explained in detail in Nikkei Electronics, Aug. 8, 1988 (No. 453), pp. 216–220, and Rajio Gijutsu [Radio Technology], Sep. 1987, pp.37–44. Hence, it is not described in detail here.

That is, as shown in FIG. 20, for the $\Delta - \Sigma$ modulator, the quantization noise generated within quantizer 30 (known as a local quantizer hereinafter) is differentiated. In this way, at the low range the quantization noise is suppressed and a small number of bits can be used to obtain the desired dynamic range. Suppose the input is X, the output is Y, and the noise of local quantizer 30 is Q, the k'th transfer characteristics of the $\Delta - \Sigma$ modulator can be represented by the following Formula (1):

$$Y = X + (1 - Z^{-1})^k \cdot Q \qquad (1)$$

There are various methods of realizing the $\Delta - \Sigma$ modulator shown in Formula (1). All of the methods with a final output represented by Formula (1) are known as $\Delta - \Sigma$ modulators. In Formula (1), $(1 - Z^{-1})^k$ represents the differential characteristics. In addition, the local quantizer has linear quantization characteristics, and has $2^m$ quantized values. Those $2^m$ values can be encoded by m bits. Also, as shown in FIG. 20, the operation of local quantizer 30 is equivalent to addition of quantization noise Q to input $X_1$. In this example, $Y = X_1 + Q$.

Suppose the magnitude of the quantizing step width of local quantizer 30 is $\Delta$, the condition is that quantization noise Q must be distributed in the range of $\pm \Delta/2$. In this case, the allowable input of local quantizer 30 becomes $2^m \Delta$ (P-P); input $X_1$ of local quantizer 30 is the sum of input X and fed-back $-Q \cdot H(Z)$ (where P-P means "peak to peak"). Also, since the maximum value of $-Q \cdot H(Z) = -Q \cdot (1 - (1 - Z^{-1})^k)$ is $$\sum_{e=1}^{k} C_e \cdot \Delta \, (P - P)$$

if $$|X| \, (p - p) + \sum_{e=1}^{k} C_e \cdot \Delta \leq 2^k \cdot \Delta,$$

the aforementioned condition is established.

If the quantization noise Q is taken as a white noise distributed in the range of $\pm \Delta/2$, its power (quantization noise power) becomes $\Delta^2/12$. Assuming the operation clock (sampling frequency) of the $\Delta - \Sigma$ modulator is fs it is believed that said power is distributed uniformly over the band to fs/2 (Nyquist frequency); hence, the power density becomes $\Delta^2/12 \cdot 2/fs$. On the other hand, if we set the amplitude characteristic of the differential characteristic $(1 - Z^{-1})^k$ as $$Z^{-1} = e^{-j2\pi f/fs},$$

we have $$|(1 - Z^{-1})^k| = 2^k \cdot \sin^k(\pi f/fs)$$

and the spectrum Nf differentiated quantization noise $$(1 - Z^{-1})^k \cdot Q$$

becomes $$Nf = 2^k \cdot \sin^k(\pi f/fs) \cdot \sqrt{\Delta^2/12 \cdot 2/fs}\,.$$

Spectrum Nf represented by this formula is the curve shown in FIG. 21. Here, input X is assumed to be a sinusoidal wave.

An example of the specific internal structure of the aforementioned $\Delta - \Sigma$ modulator can be explained with reference to FIG. 22.

As shown in FIG. 22, in this example, the so-called third-order 8-value $\Delta - \Sigma$ modulator 4 is formed. That is, as shown in the figure, $\Delta - \Sigma$ modulator 4 mainly comprises a register unit 35 which is made of 7 registers (THR1 ... THR7) for holding threshold values; a quantizer 30 which is composed of a comparison circuit unit 20 made of seven comparators (COMP1 ... COMP7) which compare the threshold values (THL1 ... THL7) from register unit 35 with the input data and output the results as the prescribed flags (f1 ... f7), respectively, an encoder unit 21 which encodes flag values (f1 ... f7) output from comparison circuit unit 20 to the prescribed output values, and a selector unit 22 which selects one value out of the various quantized values (QL1 ... QL8) of register unit 34 made of eight quantized values holding registers (QLR1 ... QLR8) corresponding to said threshold values by using the flag values (f1 ... f7) in comparison circuit unit 20; and a quantization noise differentiating filter 26 made of three delay registers R, multipliers 26a having different coefficients (1, −3, 3 in this example) and adder 26b for adding the outputs of multipliers 26a.

The operation of the aforementioned $\Delta - \Sigma$ modulator 4 can be explained as follows. First of all, i-bit input data X (a digital signal, in this example is added to data which is delayed by unit-time delay element $Z^{-1}$ by a quantization noise differentiating filter 26 and multiplied by a coefficient to become input data $X_1$ with, say (i+3) bits. In this example, 3 bits are added without decreasing the dynamic range of said input data $X_1$.

Input data $X_1$, with i+3 bits becomes the input signal to the various comparators (COMP1 ... COMP7). At comparison circuit unit 20, the input signal is compared with the various threshold levels (THL1 ... THL7) at threshold level register unit 35. The results are represented as comparison flag values (f1 ... f7), which are set to 0 when the threshold level is higher than the value of input $X_1$ and which are set to 1 when the threshold level is lower than the value of input $X_1$. Comparison flag values (f1 ... f7) go through encoder unit 21 and become a 3-bit output Y.

In addition, comparison flag values (f1 ... f7) are also sent to selector 22. Selector 22 reads the values of the comparison flags (f1 ... f7) and outputs the appropriate value from quantization level register unit 34. This output data is subtracted from (i+3)-bit input data $X_1$ to form i-bit data, which enters filter 26 for quantization noise differentiation. Each of the i-bit data then pass through unit-time delay element $Z^{-1}$ at the quantization noise differentiating filter 26, and are multiplied by a coefficient. It is then added to input data X. That is, by repeating the aforementioned operations corresponding to the value of input X, the prescribed output data Y (3-bit output data in this example) can be obtained.

FIG. 23 shows a CD (compact disc) stereo system (playback system) using said $\Delta - \Sigma$ modulator 4. This figure can be used to explain the system and its problem. A method nearly identical to the method of this example is described in Rajio Gijutsu, May 1988, pp. 140-143. Hence, explanation of the details is omitted in this case.

That is, as shown in FIG. 23, the 16-bit audio signal from CD 1 has its frequency characteristics changed at a digital equalizer 2 to form an 18-bit audio signal. Then at volume multiplier mode 8, the 18-bit data is multiplied by a 9-bit coefficient to form a 27-bit signal. The increase in the bit count from 18-bits is to prevent degradation of the output S/N (signal/noise) ratio from the input in the case when the coefficient is small, i.e., when the volume is set at a low level, which would take place if the bits added by performing multiplication were truncated. Then, oversampling is performed on the 27-bit data using an oversampling filter 3. After the sampling frequency is increased, $\Delta - \Sigma$ modulator 4 is used to reduce the bit count to form 3-bit data. After this data is returned to an analog signal by 3-bit high-speed DAC 5, a power amplifier 6 is used to amplify the data and sound is output from speaker 7.

In said stereo system, the 16-bit audio signal from CD 1 can have its volume increased or decreased by using an external operation key to operate volume multiplier mode 8. That is, the signal output from the operation key is input to microcomputer 10 for data signal processing. Afterwards, a serial control signal is output from microcomputer 10. Then, this serial control signal is sent into volume multiplier mode 8 to perform multiplication in this configuration.

In the aforementioned stereo system, volume 8 is usually provided by a multiplier, etc.; hence, the circuit scale and calculation cycle count are large, significantly increasing the burden on both hardware and software. This is a problem.

It is an object of this invention to provide a signal modulation system which can realize a small-circuit-scale system (such as a stereo system) without a multiplier, etc., that would become a burden on hardware and software.

SUMMARY OF THE INVENTION

This invention is directed to a signal modulation system characterized by the feature that it has a quantizer which quantizes the input signal and outputs it as the prescribed output signal, and a control circuit portion which makes the quantizing step width in the quantizer vary corresponding to a control signal.

BRIEF DESCRIPTION OF THE DRAWINGS

Other objects, features and advantages of the invention will appear more fully from the following detailed description thereof taken in connection with the accompanying drawings, wherein:

FIG. 2 is a block diagram illustrating the example when the $\Delta - \Sigma$ modulator in FIG. 1 is applied in a CD stereo system.

FIGS. 3, 4 and 5 are diagrams illustrating the operations of the $\Delta - \Sigma$ modulator in FIG. 1 when the quantization step width is not changed.

FIG. 6 shows the correspondence relationship between 3-bit output Y and the quantized value in FIGS. 3, 4 and 5.

FIGS. 7, 8 and 9 are diagrams illustrating the same operations as those described above when the quantization step width is changed to 4 times that in the case shown in FIGS. 3, 4 and 5.

FIG. 10 shows the correspondence relationship between the 3-bit output Y and the quantized value in the case of FIGS. 7, 8 and 9.

FIG. 11A is a diagram illustrating the waveform of the 3-bit input X corresponding to the case of FIGS. 3, 4 and 5.

Symbols used in the figures are as follows: 1 CD; 2, digital equalizer; 3, oversampling filter; 4, 40, $\Delta-\Sigma$ modulator; 5, 3-bit high-speed DA converter; 6, power amplifier; 7, speaker; 10, microcomputer for system control; 20, comparison circuit unit; 21, encoder unit; 22, selector unit; 23, threshold level ROM; 24, quantization level ROM; 26, quantization noise differentiating filer; 27, address latch circuit; 30, quantizer; 41, control circuit unit; COMP1 . . . COMP7, comparators; THL1 . . . THL7, threshold levels; QL1 . . . QL8, quantization levels

DESCRIPTION OF THE PREFERRED EMBODIMENTS

In the following, this invention will be explained with reference to an application example.

In order to solve the aforementioned problem of volume control as provided by a multiplier, the following approaches have been taken: instead of controlling the signal outside of the modulator (i.e., instead of controlling the volume via a multiplier as described above), the quantization step width delta of the local quantizer within the modulator is varied; corresponding to the variation amount, the output of the local quantizer is normalized, so that the amplitude of the input signal component in the output is controlled (i.e., the volume is controlled).

FIGS. 1-19 illustrate an example of this invention used in a $\Delta-\Sigma$ modulator.

FIGS. 16-19 illustrate the theoretical base of this application example.

Figure 16:
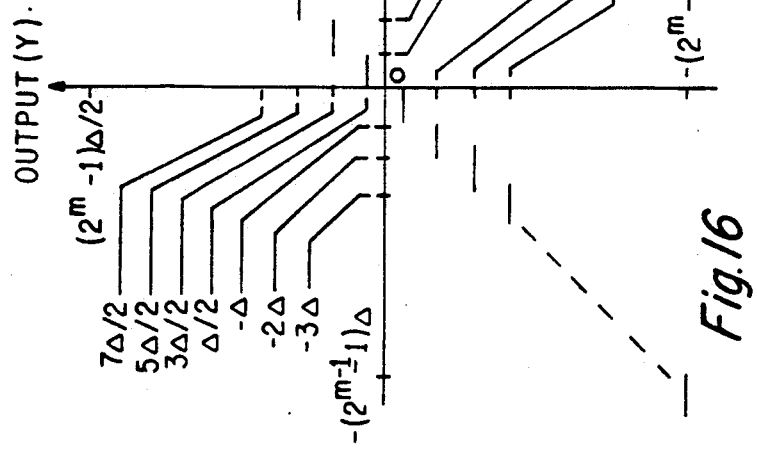
FIG. 16 is a graph illustrating the quantization characteristics in the case when the quantization step width $\Delta$ is not changed in the k'th $\Delta - \Sigma$ modulator.
Figure 20:
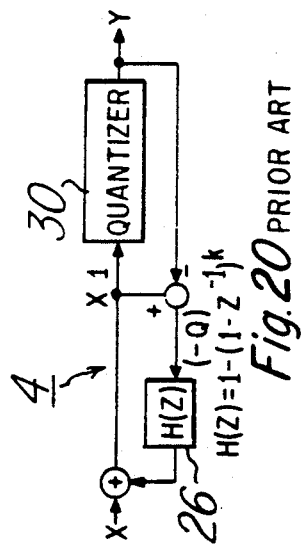
FIG. 20 is a block diagram illustrating the configuration of a conventional k'th $\Delta - \Sigma$ modulator.

FIG. 16 shows the quantization characteristics of local quantizer 30 of $2^m$ values used in the k'th $\Delta-\Sigma$ modulator shown in FIG. 20, with a quantization step width of $\Delta$, quantized values (output Y) of $2^m$ values, namely, $\pm\Delta/2, \pm3\Delta/2, \ldots \pm(2^m-1)\Delta/2$, and threshold levels of $2^m-1$, namely, $0, \pm\Delta, \pm 2\Delta, \ldots \pm(2^{m-1}-1)\Delta$. In this case, as pointed out above, the transfer function of the $\Delta-\Sigma$ modulator can be represented as $$Y = X + (1-Z^{-1})^k \cdot Q \quad (1)$$

Quantization noise Q must be taken as white noise distributed within $\pm\Delta/2$, with its spectrum Nf represented as $$Nf = 2^k \cdot \sin^k(\pi f/fs) \cdot \sqrt{\Delta^2/12 \cdot 2/fs} \quad (2)$$

Figure 21:
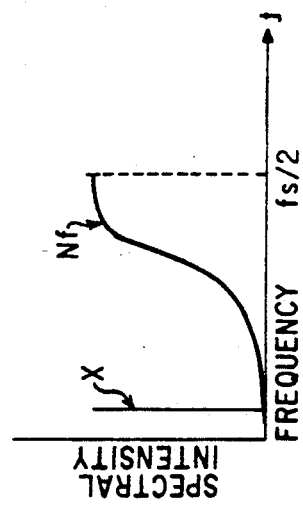
FIG. 21 illustrates the spectrum-frequency characteristics in the conventional example of FIG. 20.

(see FIGS. 20 and 21).

In this case, with input X unchanged, quantization step width $\Delta$ increased by (a) times to $a\cdot\Delta$ (where $a>1$), quantization noise of Q', and output of Y', then, similar to Equation (1), we have $$Y' = X + (1-Z^{-1})^k \cdot Q' \quad (3)$$

Figure 17:
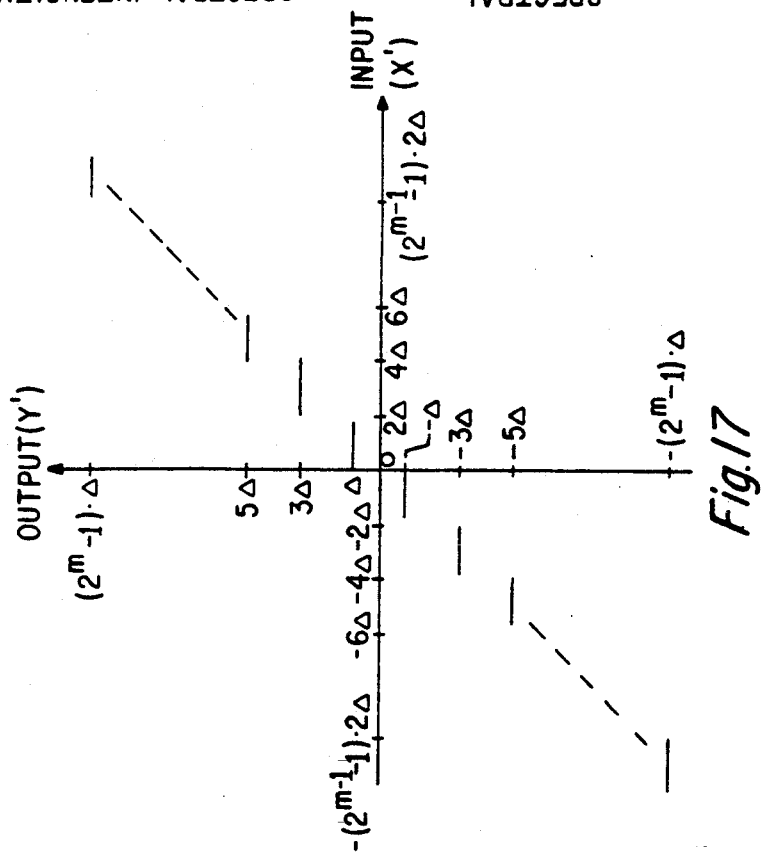
FIG. 17 is a graph illustrating the quantization characteristics in the case when quantization step width $\Delta$ in the k'th $\Delta - \Sigma$ modulator is doubled.

Consequently, Q' is distributed in $\pm a\cdot\Delta/2$, quantized values (output Y') take $2^m$ values, namely, $\pm a\cdot\Delta/2, \pm 3a\cdot\Delta/2, \ldots \pm(2^m-1)a\cdot\Delta/2$, and threshold levels take $2^m-1$ values, namely $0, \pm a\cdot\Delta, \pm 2a\cdot\Delta, \ldots \pm(2^m-1)a\cdot\Delta$. That is, they all become (a) times the aforementioned values. Also, for the purpose of reference, FIG. 17 shows the quantization characteristics when $a=2$.

As Equations (1) and (3) are compared with each other, it can be seen that both Y and Y' take $2^m$ values, while Y' is (a) times Y; X takes the same values in both cases; and Q' is taken as a white noise distributed in a range (a) times that of Q. When both sides of Equation (3) are divided by (a), we have $$Y'/a = X/a + (1-Z^{-1})^k \cdot Q'/a \quad (4)$$

The $2^m$ values that can be taken by Y'/a are the same as those of Y; and Q'/a becomes white noise distributed in $\pm\Delta/2$, i.e., equivalent to Q. That is, when Equations (1) and (4) are compared with each other, it can be seen that both outputs take the $2^m$ values of $\pm\Delta/2, \pm 3\Delta/2, \ldots, \pm(2^m-1)\Delta/2$, their quantization noise spectrums are also the same, while input X in Equation (4) becomes 1/a times in the output. In this case, the quantization step width $\Delta$ becomes (a) times; correspondingly, the output is made 1/a times (i.e., normalized) so that the quantization noise spectrum is not changed, while the amplitude of the input signal component in the output becomes 1/a times. This state corresponds to the state when the volume is set at a low level.

In this case, in order to find spectrum Nf of $(1-Z^{-1})^k \cdot Q'$, it is only necessary to replace $\Delta$ in Equation (2) by $a \cdot \Delta$; then we obtain:

$$\begin{aligned} Nf &= 2^k \cdot \sin^k(\pi f/fs) \cdot \sqrt{(a\cdot\Delta)^2/12 \cdot 2/fs} \\ &= a \cdot 2^k \cdot \sin^k(\pi f/fs) \cdot \sqrt{\Delta^2/12 \cdot 2/fs} \\ &= a \cdot Nf \end{aligned} \quad (5)$$

Figure 18:
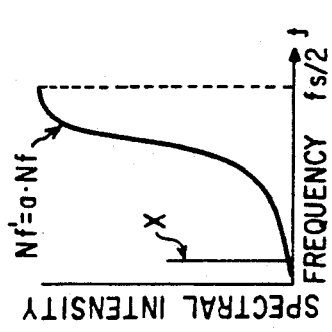
FIG. 18 is a graph illustrating the spectrum-frequency characteristics in the case when the quantization step width $\Delta$ in the k'th $\Delta - \Sigma$ modulator is increased by a factor of (a).
Figure 19:
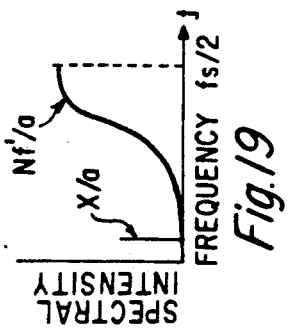
FIG. 19 shows the spectrum-frequency characteristics in the case when the output of the modulator is normalized by a factor of (1/a).

The aforementioned operation process can be represented by a spectrum as shown in FIGS. 18 and 19.

In addition, in the case when the quantization step width $\Delta$ is set to 1/a times, the operation becomes reverse to the aforementioned operation, and the amplitude of the input signal component in the output is set as (a) times. That is, this case corresponds to the state when the volume is set at a high level.

Figure 23:
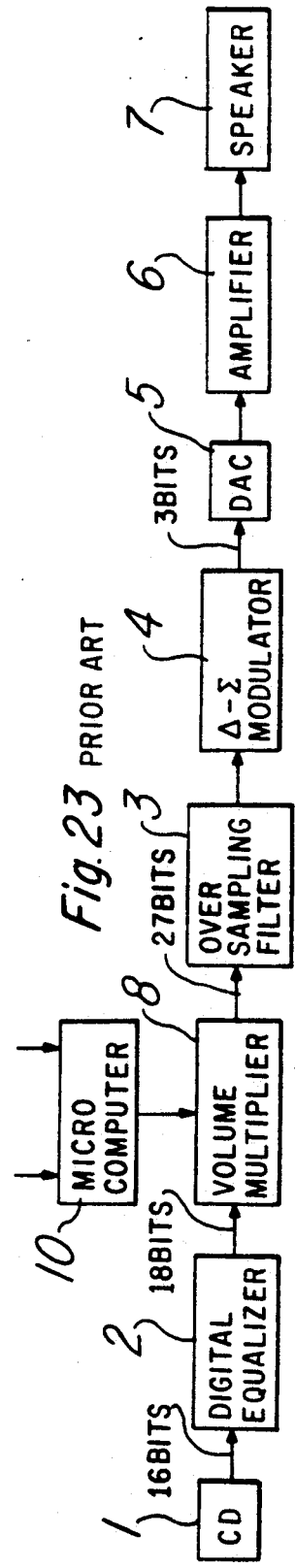
FIG. 23 is a block diagram illustrating a CD stereo system which uses the conventional $\Delta-\Sigma$ modulator of FIG. 20.

For the $\Delta-\Sigma$ modulator performing the aforementioned operation, in order to control the amplitude of the input signal component in the output, there is no need to use a multiplier as shown in FIG. 23. Instead, what is needed outside the $\Delta-\Sigma$ modulator itself are the quantized values that vary together with the variation in the quantization step width and control the threshold level. For example, as will be explained later, these values may be stored in ROM or other memory, and the value is read out corresponding to the amplitude control quantity (i.e., the control quantity of the volume) and sent to the $\Delta-\Sigma$ modulator.

In addition, as described above, the output of the $\Delta-\Sigma$ modulator takes $2^m$ values of $\pm\Delta/2, \pm 3\Delta, \ldots \pm(2^m-1)\Delta/2$. Usually, these values are encoded and sent out as m-bit output. Hence, in the local quantizer, as will be explained later, a comparator is used to compare the input of the quantizer with the threshold level, and the flag output of the comparator is encoded. In this way, there is no need to use a divider or other special circuit to perform normalization.

In the following, with reference to FIG. 1, the internal structure of the $\Delta-\Sigma$ modulator of this example will be explained.

Figure 22:
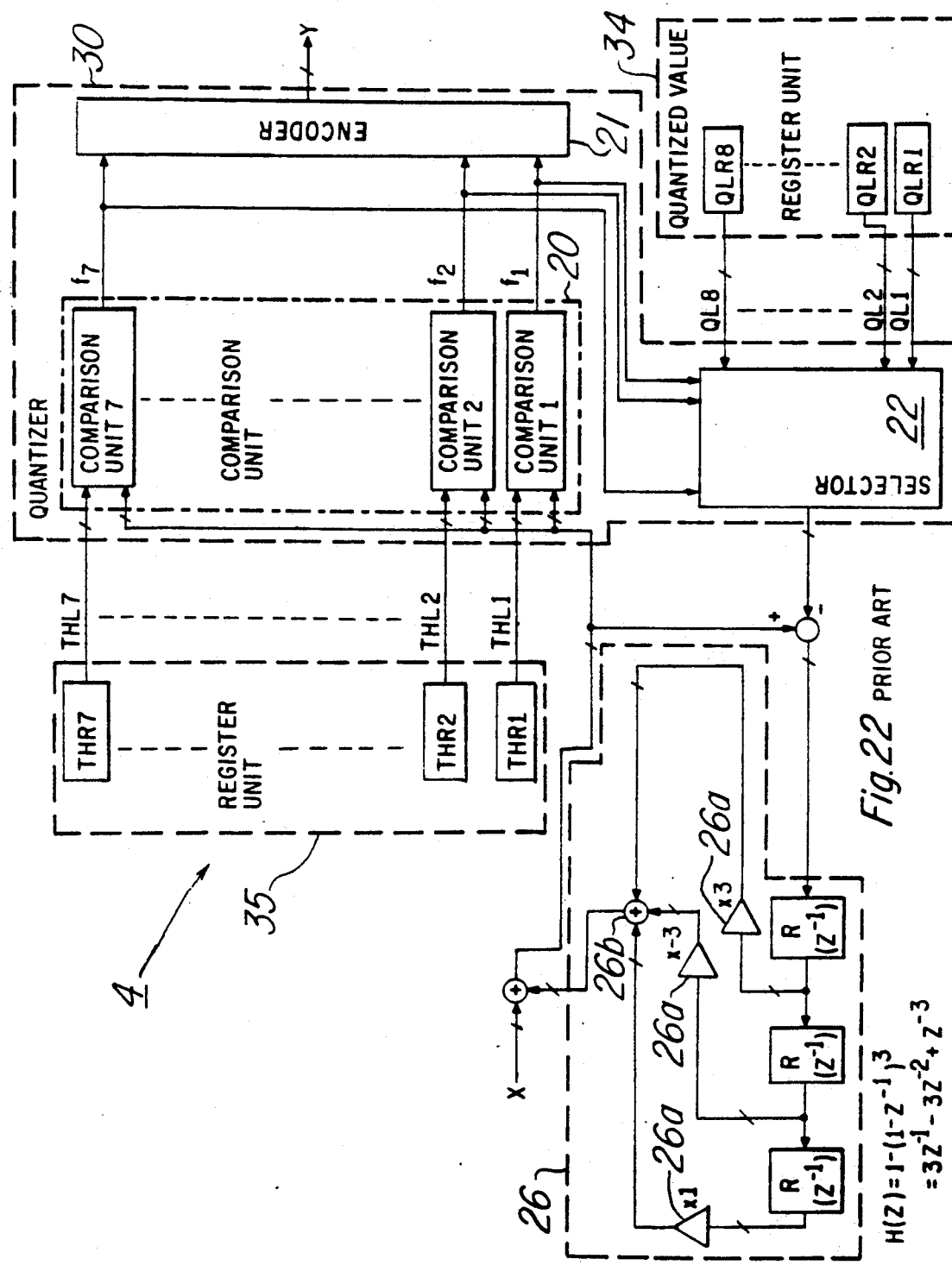
FIG. 22 is a block diagram illustrating the internal circuit configuration of the $\Delta - \Sigma$ modulator in the conventional example of FIG. 20.

For this internal structure, in order to simplify the explanation, the portions identical to those shown in FIG. 22 are represented by the same symbols and their explanation is omitted here. The point different from the method shown in FIG. 22 is as follows: as shown in the figure, the prescribed values needed to change the aforementioned quantization step width Δ (i.e., to change the threshold value and quantized value) are stored in the form of a table in a memory (ROM, in this example); the value corresponding to the amplitude control quantity (i.e., the volume control quantity) is read from said ROM and sent to the quantizer of the Δ−Σ modulator upon the control signal of the microcomputer.

Figure 1:
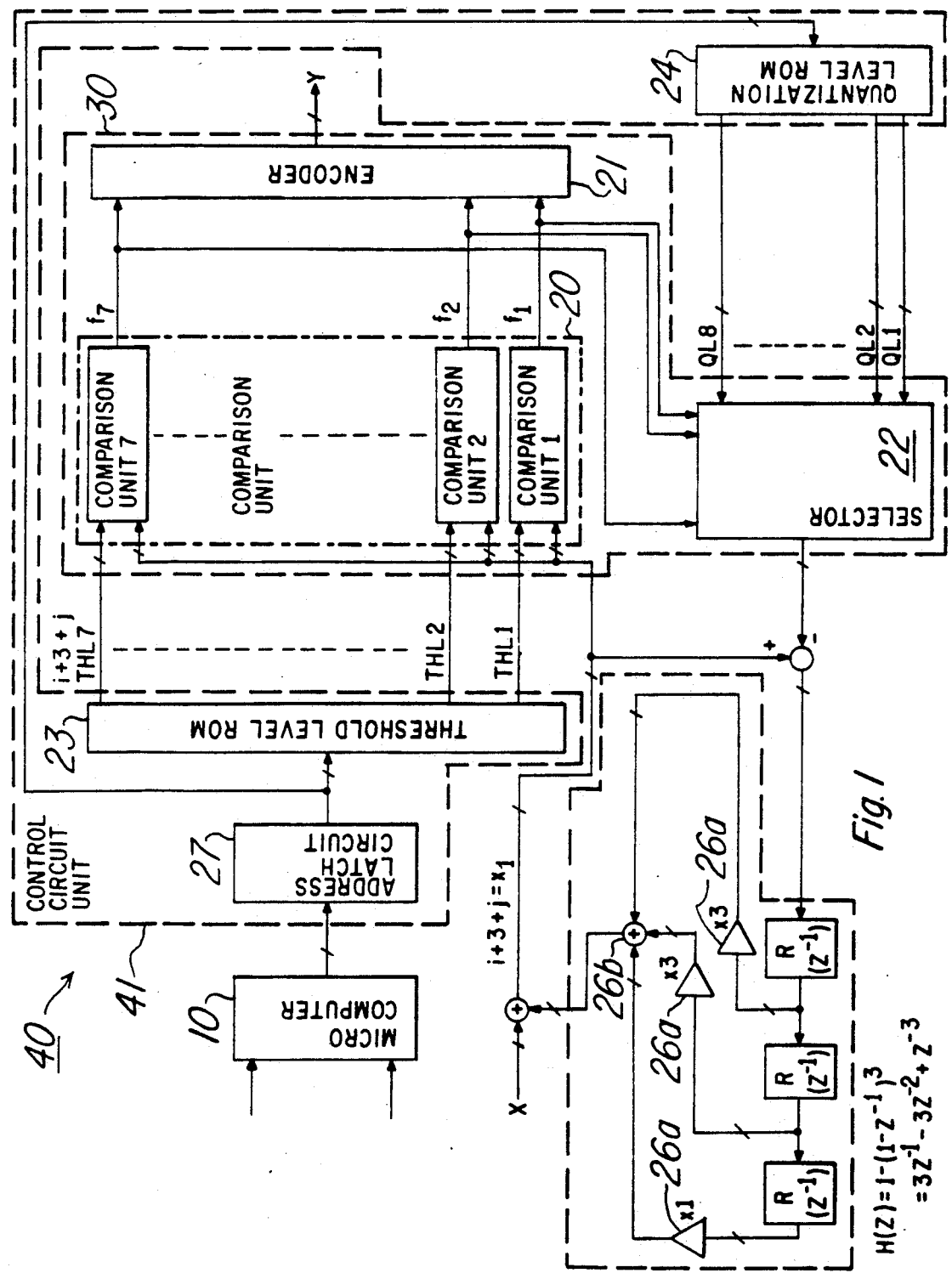
FIG. 1 is a block diagram illustrating the configuration of the internal circuit in an example of the $\Delta - \Sigma$ modulator of this invention.

That is, in this example, as shown in FIG. 1, Δ−Σ modulator 40 has a control circuit portion 41 which mainly comprises an address latch circuit 27 which receives a control signal from microcomputer 10 and generates the prescribed address signal, a threshold level ROM 23 which receives the address signal from address latch circuit 27 and sends the prescribed threshold value and quantized value to quantizer 30, and quantization level ROM 24. This control circuit portion 41 can set appropriate values for the threshold value and quantized value of quantizer 30 in Δ−Σ modulator 40.

Another point where the example shown in FIG. 1 differs from the example shown in FIG. 22 is that, with respect to the i-bit data of input X, data $X_1$ obtained by adding the unit-time delay element by quantization noise differentiating filter 26 has (i+3+j) bits, i.e., with j bits added [to what is obtained in FIG. 22]. The reason is that by adding j bits to the data width, it is possible to enlarge the quantization step width to $2^j$ times that in the case of FIG. 22.

FIGS. 3-10 illustrate an example of the operation of Δ−Σ modulator 40 using said method shown in FIG. 1.

First of all, by using the operation key, etc., the external volume control command is sent through microcomputer 10 to ROM address latch circuit 27. For example, this ROM address latch circuit may be made of a 74HC164, product of Texas Instruments Incorporated. This latch circuit 27 sets, say, address (00). This address is sent to both threshold level ROM 23 and quantization level ROM 24, and the data set in these ROMS are read out, respectively. In this case, ROMs 23, 24 may be made of a TMS27C291, product of Texas Instruments Incorporated. Threshold level ROM 23 outputs 7-step threshold values (THL1-THL7) represented by eight bits. Hence, the threshold values (THL1, THL2, THL3, . . . THL7) are represented in sequence as (−24, −16, −8, . . . 24).

First, as shown in FIG. 3, consider the case when data of (001)=1 is sent in as input X (node (1)). In this case, as quantization noise differentiating filter 26 has nodes (9), (10), (11), (12) set at 0 as the initial value, value 1 of input X (node (1)) is added to value 0 of node (12), and data 1 is output to node (2). This data value 1 is then compared with said 7-step threshold levels at comparator unit 20, respectively.

Figure 13:
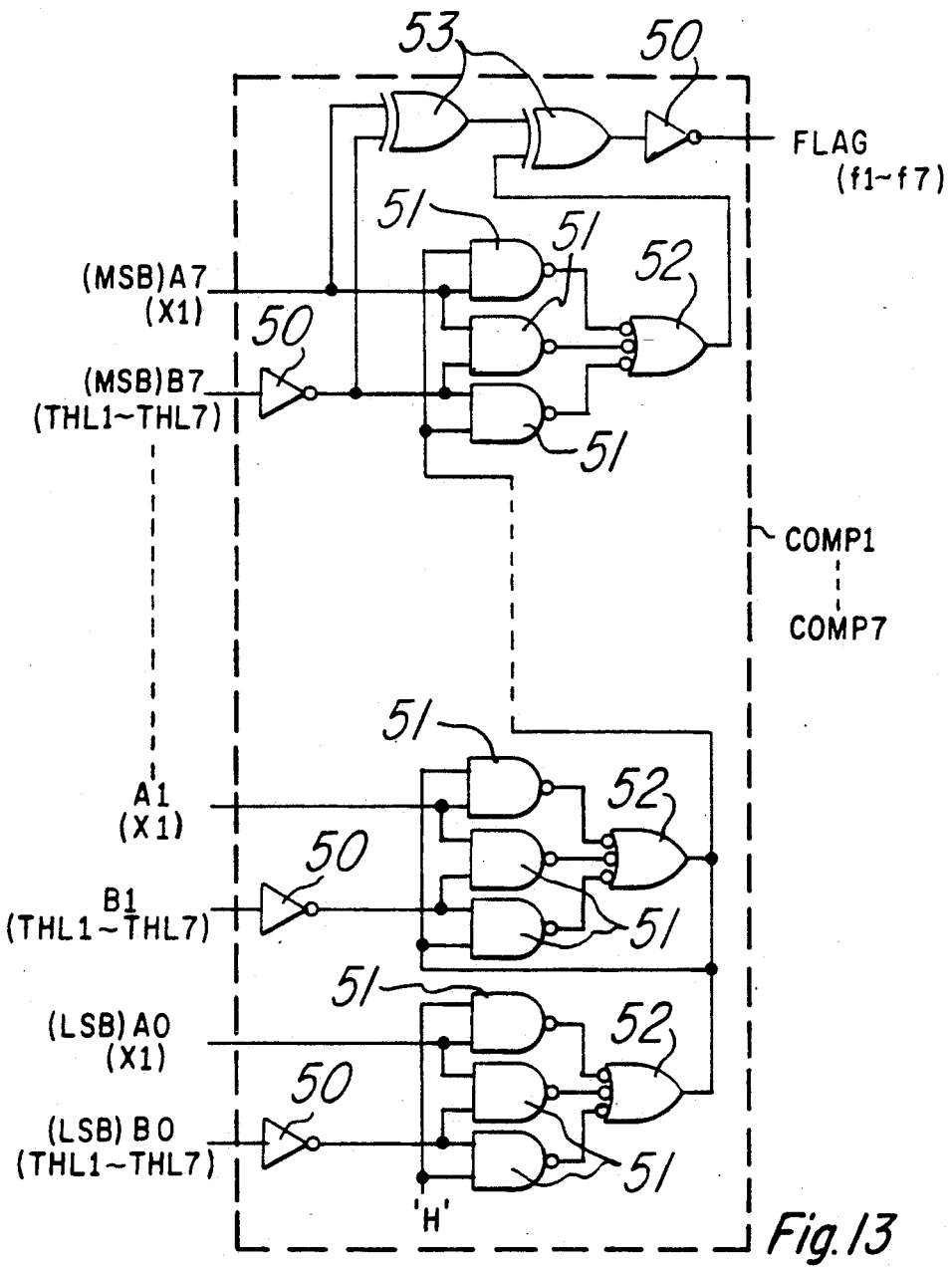
FIG. 13 is a logic circuit diagram illustrating an example of the comparators in the example of FIG. 1.

The role of comparator unit 20 is to compare the common input signal (data at node (2)) to all the comparators (COMP1, . . . COMP7) with the threshold levels input to the various comparators (COMP1, . . . COMP7), respectively, with the results output as comparison flags (f1 . . . f7), which are set as 0 when said threshold level is higher than the input value (value at node (2)) or set as 1 when said threshold level is lower than the input value. The circuit of each comparator (COMP1, . . . COMP7) is as shown in FIG. 13, as shown in FIG. 13, each comparator comprises eight inverters 50, which compare A (A0 . . . A7, values at node (2)) with B (B0 . . . B7, threshold values) and set f="H" if A≧B or f="L" if A<B, twenty-four NAND circuits 51, eight NOR circuits 52, and two EXCLUSIVE OR circuits 53.

As shown in FIG. 3, as said value at node (2) is compared with said threshold value, the comparison flag values become (f1, f2, f3, f4, f5, f6, f7) =(1, 1, 1, 1, 0, 0, 0). That is, as shown in FIG. 3, the data value 1 at node (2) is larger than level (0 0 0 0 0 0 0 0)=0 of threshold level THL4 of comparator COMP4, while it is smaller than level (0 0 0 0 1 0 0 0)=8 of threshold level THL5 of comparator COMP5. For the quantization level in this case, output Y of encoder 21 has 3 bits. Hence, according to the encoding rule shown in FIG. 6 to be described later, output Y is made to correspond to (1 0 0)=4 in this example. That is, in this case, although there are seven comparison flags (f1 . . . f7), there are only eight values that can be taken. Hence, a 3-bit encoder 21 ($2^3$=8 values) is used.

Figure 14:
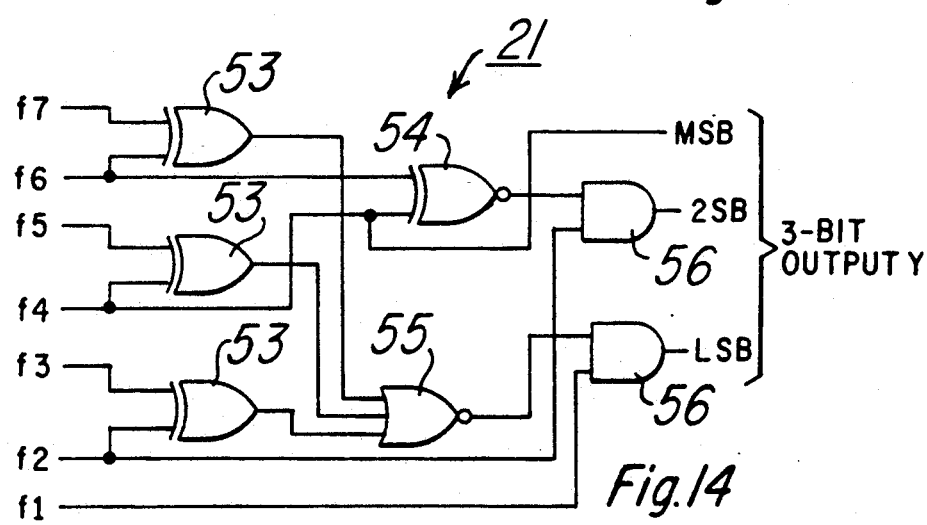
FIG. 14 is a diagram of the logic circuit illustrating an example of the encoder.

As an example, the circuit shown in FIG. 14 can be used as the circuit of encoder 21. As shown in FIG. 14, this circuit comprises three EXCLUSIVE OR circuits 53, one EXCLUSIVE NOR circuit 54, one NOR circuit 55, and two AND circuits 56.

The encoding rules of encoder 21 can be set freely by the designer. However, the rules should be set appropriately to avoid contradiction with DAC 5 at the rear portion of encoder 21. FIG. 6 shows the correspondence between the output of the encoder 21, (node (3)), and the threshold value, as well as the quantized value.

As shown in FIGS. 3 and 6, quantization level selector 22 reads the values of said f1 . . . f7, selects QL5=4 from outputs (QL1 . . . QL8) of quantization level ROM 24, and sends this value to node (4). Then, data value (4) at node (4) is subtracted from data (1) at node (2); the obtained value −3 is sent out to node (5).

Figure 15:
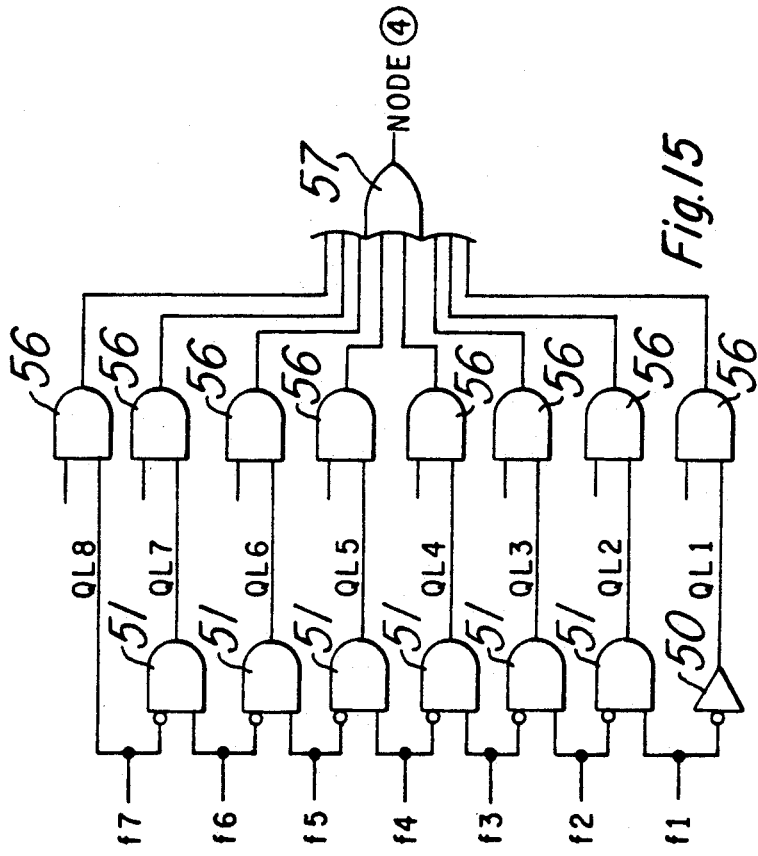
FIG. 15 is a diagram of the logic circuit illustrating an example of the selector.

As an example, the circuit shown in FIG. 15 may be used as the circuit of selector 22. As shown in FIG. 15, this circuit for 1 bit of data comprises one inverter circuit 50, six NAND circuits 51, eight AND circuits 56 and one OR circuit 57. As shown in FIG. 15, the data of f1, for example, is sent into inverter 50 and NAND circuit 51, respectively. The output of inverter 50 is sent together with the data of QL1 of quantization level ROM 24 to AND circuit 56. The output of AND circuit 56 is input to OR circuit 57.

Figure 4:
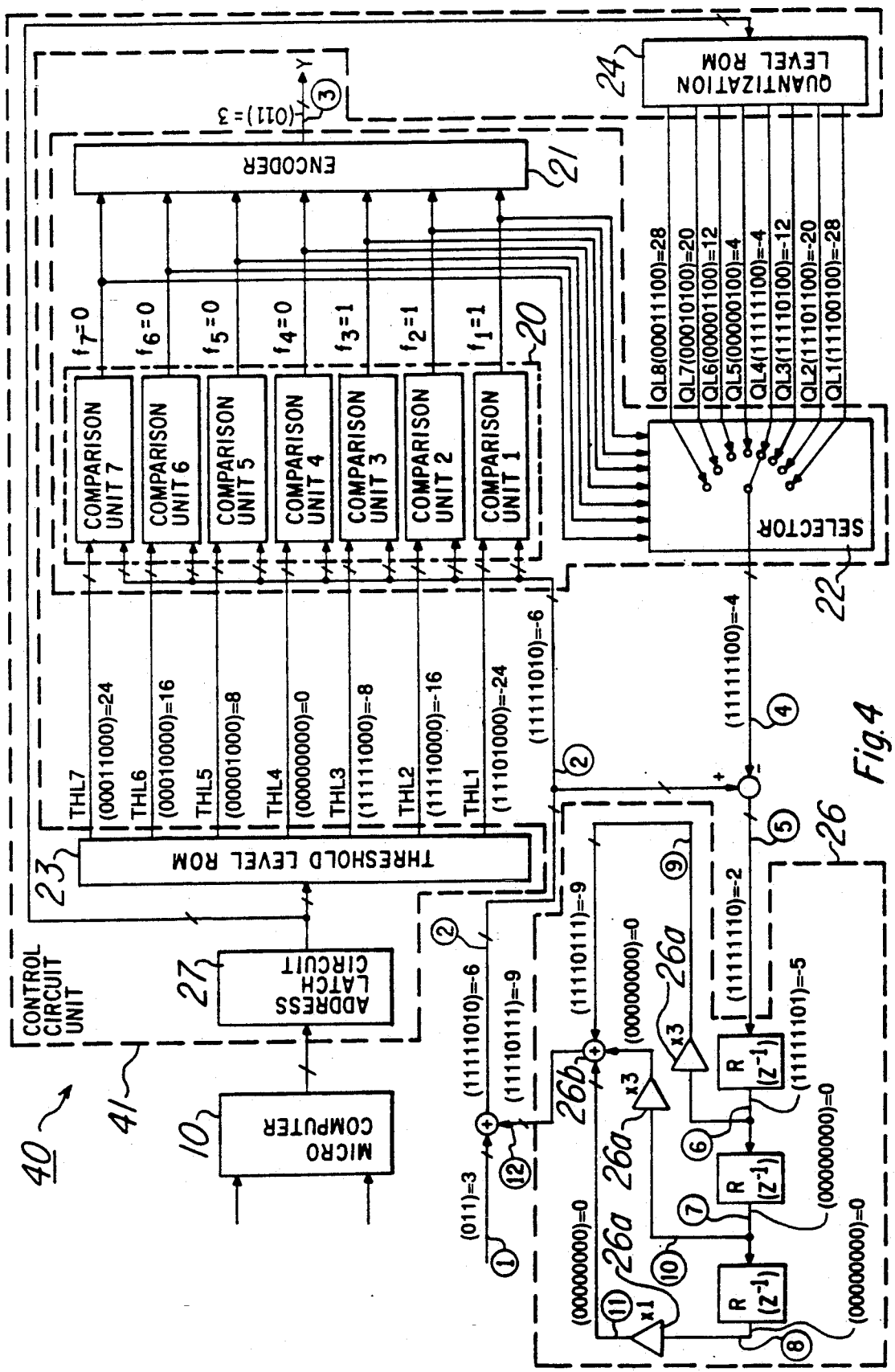

Next, consider the case when (0 1 1)=3 is input to input x (node (1)) as shown in FIG. 4. In this case, the values of output nodes (6), (7), (8) of the various delay registers R in quantization noise differentiating filter 26 are shifted in sequence one by one from the state shown in FIG. 3. At node (6), the content (1 1 1 1 1 1 0 1)=−3 of node (5) in FIG. 3 appears. Consequently, the value of node (9) becomes −9, which is 3 times said value with the aid of multiplier 26a. Values of nodes (7), (8), (10), (11) are 0; hence, the value of node (12) is identical to −9, the value of node (9).

The value of node (1) is added to the value of node (12), (1 1 1 1 1 0 1 0)=−6 is output at node (2), and it enters the various comparators in comparator unit 20 (COMP1 . . . COMP7). As shown in FIG. 4, the value of node (2) is between THL3 and THL4; hence, the values of flags f1 . . . f3 become 1, while the values of f4 . . . f7 become 0. As shown in FIGS. 4 and 6, due to these flag values, encoder 21 outputs (0 1 1)=3. As shown in FIG. 4, quantized value QL4 (=−4) is selected at quantization level ROM 24.

Consequently, node (5) gets a value of −2, which is obtained by subtracting from the value −6 of node (2) the value −4 of node (4).

Figure 5:
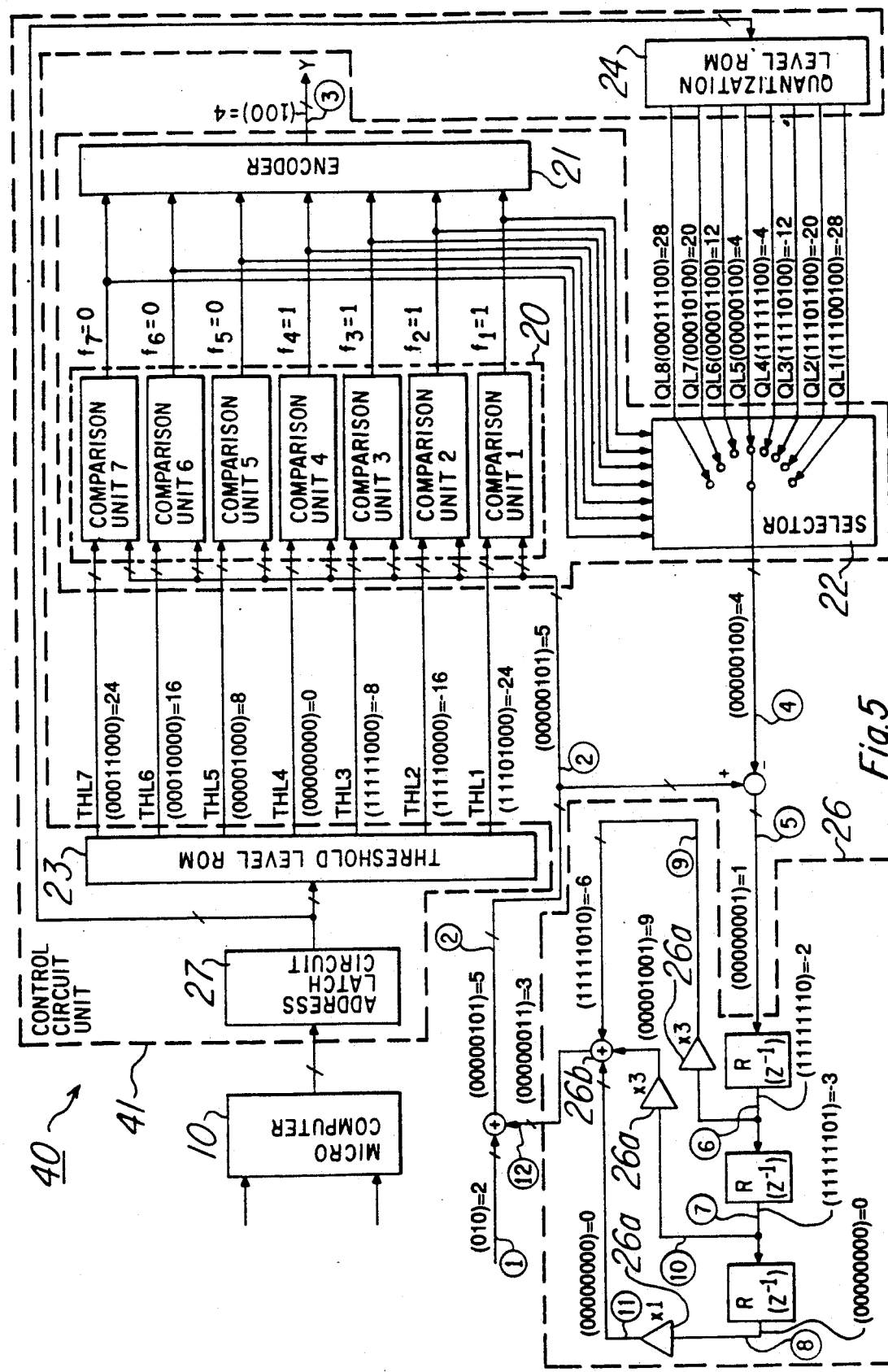

In addition, as shown in FIG. 5, consider the case when (0 1 0)=2 is input to input x (node (1)). In this case, the values of the delay registers R of quantization noise differentiating filter 26 are shifted one by one from said state shown in FIG. 4. Consequently, −3 is input from node (6) to node (7). In addition, −2 is shifted from node (5) to node (6). As a result, a value of (0 0 0 0 1 0 0 1)=9, i.e., −3 times the value of node (7), appears at node (10); and a value of (1 1 1 1 1 0 1 0)=−6, i.e., 3 times the value of node (6), appears at node (9), while the values of nodes (8) and (11) remain 0. The value of node (12) is equal to a sum of the values of nodes (9), (10), and (11), i.e., it becomes (0 0 0 0 0 1 1)=3. In this case, as 2 is input to input X (node (1)), the value of node (2) becomes (0 0 0 0 1 0 1) =5. As this value is input to the various comparators (COMP1 . . . COMP7) just as described above in FIG. 5, according to the rules shown in FIG. 6, it becomes between THL4 and THL5, and the 3-bit output value of Y (node (3)) becomes (1 0 0)=4. For the quantized value, as QL5 (=4), the value of node (4) becomes 4, and the value of node (5) becomes 1. Afterward, in the same way as above, new data is sent into input X (node (1)), and the aforementioned operations are repeated in the same way.

Between the aforementioned operations, the value of the ROM address of address latch circuit 27 is (00), and there is no change in quantization characteristics (threshold level and quantization level). Besides, in this example, the ROM address uses two bits. Hence, it is possible to change the quantization level or the threshold level for any of four values at will.

FIGS. 7-10 illustrate the operation in the case when the value of the quantization step width in Δ−Σ modulator 40 of this example (i.e., the threshold value and quantized value) is made four times the value in the case explained in FIGS. 3-6. However, the basic operation in this case is the same as that explained above in FIGS. 3-6. Hence, the explanation is omitted here to save space. In addition, in this case, the ROM address of address latch circuit 27 used is (11), and the value of input X (node (1)) becomes the same as that in the case shown in FIGS. 3-5. FIG. 10 illustrates the correspondence relationship in the case when the quantization level, the threshold level and the 3-bit output value are made four times those in FIG. 6.

First of all, explanation can be made with reference to FIG. 7 (see also FIG. 3). In this case, as the quantization step width is increased by a factor of 4, the values of threshold level ROM 23 (THL1 . . . THL7) become 4 times the values in FIG. 3. The values of quantization level ROM 24 (QL1 . . . QL8) are also increased by a factor of 4. Just as in the case shown in FIG. 3, suppose 1 is input to input X (node (1)). As initial value 0 is set in delay registers R of quantization noise filter 26, the values of nodes (6), (7), (8) are 0. Hence, the values of nodes (9), (10), (11), (12) are also 0. As the value of node (12) is 0, the value of node (2) becomes 1. As it is input to comparison circuit unit 20 (COMP1 . . . COMP7), the value is between THL4=0 and THL5=32 shown in FIGS. 7 and 10.

The values of comparison flags become (f1, f2, f3, f4, f5, f6, f7)=(1, 1, 1, 1, 0, 0, 0). As shown in FIG. 10, (1 0 0) is output as the 3-bit output Y. Also, since the quantized value is QL4, the value of node (4) becomes 16, and the value of node (5) becomes −15.

Figure 8:
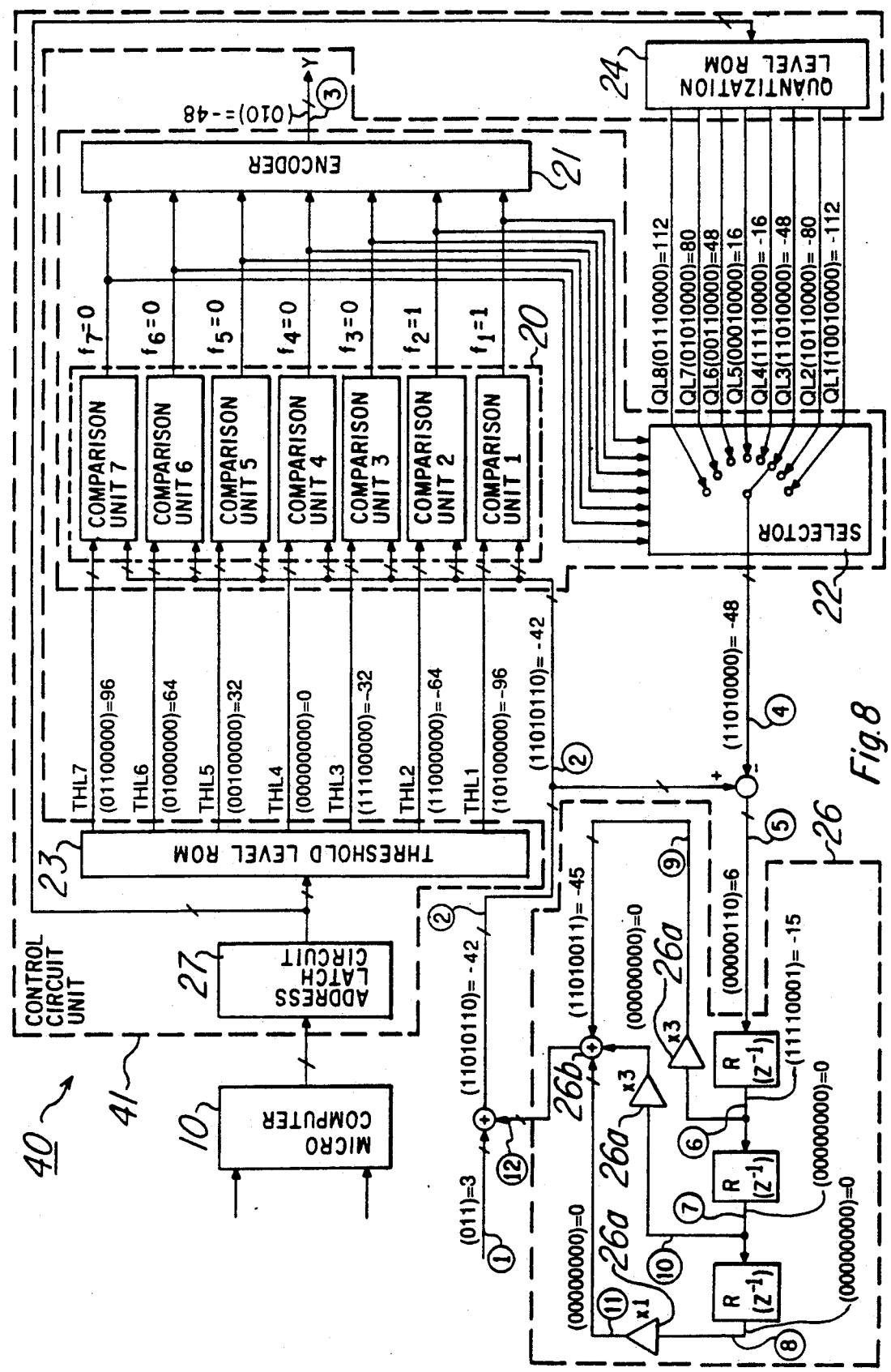
Figure 9:
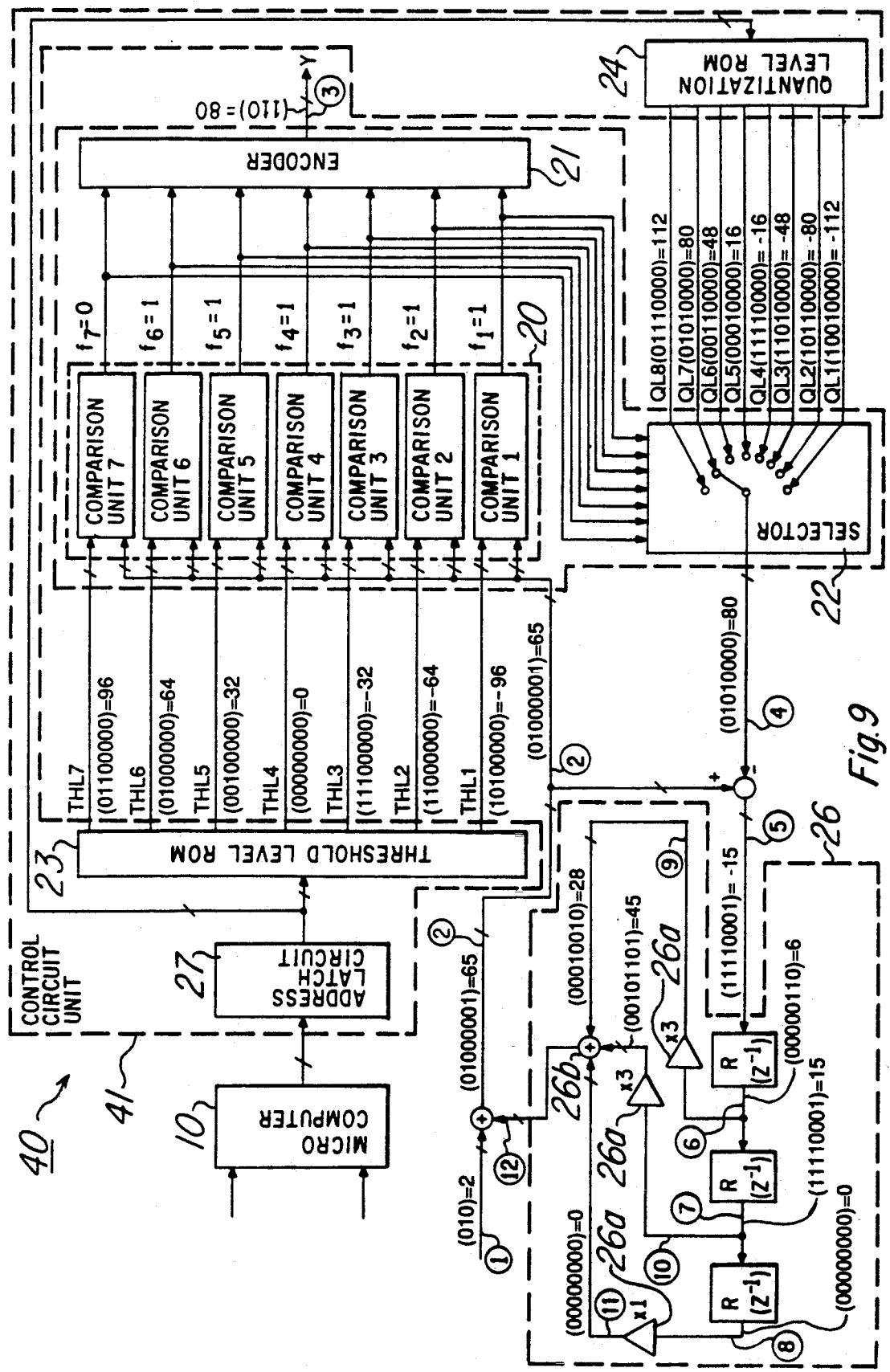

FIGS. 8 and 9 are diagrams illustrating the various operations in Δ−Σ modulator 40 when the value of input X (node (1)) is set as (0 1 1)=3 and (0 1 0)=2, respectively. As the basic operation is identical to that in the case of FIG. 7, it is not explained again. As shown in FIGS. 8 and 9, the values of output Y (node (3)) corresponding to said values of input X become (0 1 0) = −48 and (1 1 0)=80, respectively.

Figure 11B:
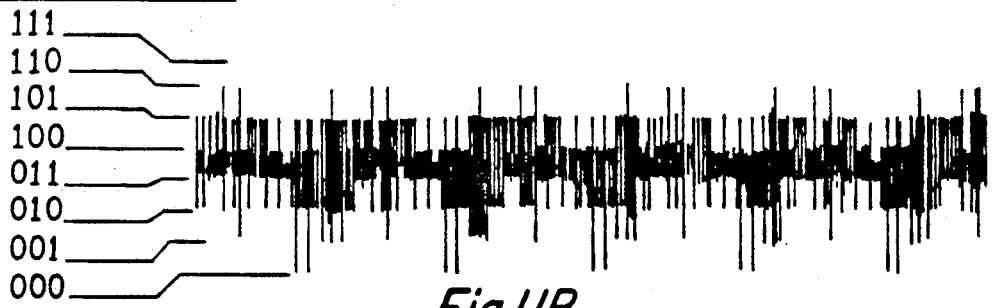
FIG. 11B shows the waveform of 3-bit output Y in the same case.
Figure 11C:
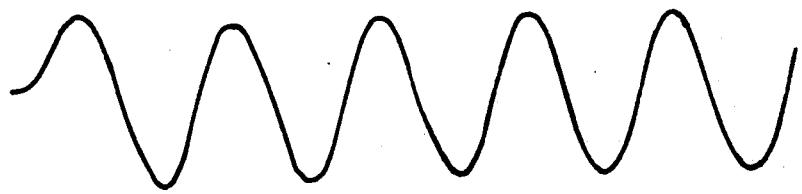
FIG. 11C shows the sinusoidal waveform after the waveform in FIG. 11B passes through a low-pass filter.

In this example, the 3-bit input signal shown in FIG. 11A is input to Δ−Σ modulator 40; the output 3-bit waveform and the sinusoidal wave form obtained after the 3-bit output waveform passes through an LPF not shown in the figure are shown in FIGS. 11B and 11C.

Figure 12A:
FIG. 12A shows the waveform of 3-bit input X corresponding to the case of FIGS. 7, 8 and 9.
Figure 12B:
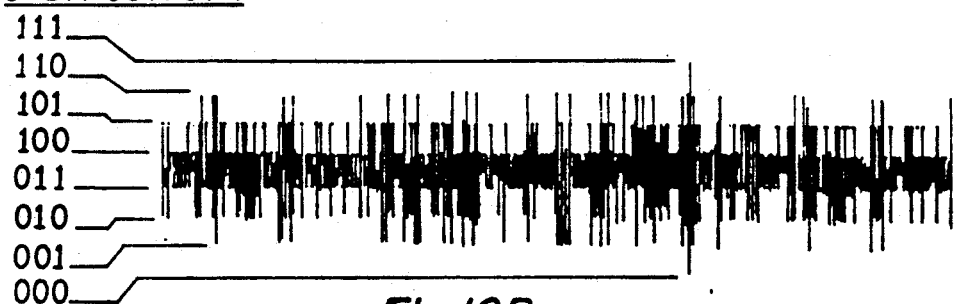
FIG. 12B shows the waveform of 3-bit output Y in the same case.
Figure 12C:
FIG. 12C shows the sinusoidal waveform after the waveform of FIG. 12B passes through a low-pass filter.

FIGS. 12A, 12B, and 12C show the 3-bit input signal, 3-bit output waveform and the sinusoidal waveform obtained after the 3-bit output waveform passes through the LPF (not shown) in the figure, respectively, in the case when the quantization step width is set as four times that of FIG. 11.

When comparison is made with FIG. 11, as can be seen from FIGS. 11C and 12C, the amplitude of the sinusoidal waveform becomes ¼ in this case.

The above explanation is made with respect to an operation for reducing the amplitude (i.e., to reduce the volume level). Similar control can be performed in the case when the amplitude is to be increased (i.e., when the volume level is to be raised). That is, in this example, by reducing the quantization step width Δ of Δ−Σ modulator 40, the amplitude of the output signal can be increased.

As explained above, in Δ−Σ modulator 40 of this example, there is a control circuit unit 41, including address latch circuit 27, threshold level ROM 23, and quantization level ROM 24, which makes quantization values (QL1 . . . QL8) and threshold values (THL1 . . . THL7) (i.e., quantization step width) in quantizer 30 vary according to the control signal from microcomputer 10; in this way, as explained above, volume control is performed by the Δ−Σ modulator. Consequently, there is no need to perform volume control using multiplier 8 as shown in FIG. 23, and a stereo system shown in FIG. 2 can be formed. As a result, both the burden on the hardware and that on the software are reduced, and the stereo system realized has a small circuit scale.

In addition, by storing the values corresponding to the prescribed volumes in threshold level ROM 23 and quantization level ROM 24, the aforementioned control of volume (amplitude) can be performed appropriately.

This invention is explained above with reference to an example. This example can be modified based on the technical idea of this invention.

For example, in the above example, ROMs are used as the quantization value memory and the threshold value memory (ROMs may include mask ROMs, EPROMs, and other types). However, RAM (Random Access Memory), etc., may also be used. Various modifications may also be made to the circuit configurations in said control circuit unit 41. In addition to the third order described above, other appropriate order may also be adopted for Δ−Σ modulator 40.

In the above example, this invention is applied to control of the signal amplitude of a variable amplitude analog signal. This invention may also be used to control other appropriate signals. In addition to the aforementioned Δ−Σ modulator method, this invention may also be used for other modulation methods, such as Δ (delta) modulation.

Also, in the aforementioned example, this invention is applied to a stereo system. However, it may also be applied to TV, radio, tape recorder, telephone, and other appropriate systems.

As explained above, according to this invention, there is provided a control circuit which makes the quantization step width of the quantizer vary corresponding to a control signal; in this way, a signal modulator which can perform control of the amplitude (volume) of the signal can be provided. As a result, it is possible to realize a stereo system with a smaller circuit scale without requiring a multiplier, etc., which would become a hardware/software burden.

What is claimed is:

1. A signal modulation system for converting a plural-bit digital input signal to an encoded-bit digital output signal representative of an analog signal having a variable amplitude by employing the delta-sigma modulation technique, said signal modulation system comprising:

input means for receiving a binary plural-bit digital input signal to be converted to an encoded-bit digital output signal representative of an analog signal having a variable amplitude;

memory means having a plurality of threshold values and quantizing values respectively stored therein;

comparator means connected to said memory means and to said input means and having a plurality of comparators for respectively receiving threshold values from a set of threshold values provided by said memory means;

selector means coupled to the output of said comparator means and to said memory means for receiving quantizing values from said memory means and selecting one quantizing value corresponding to the output from said comparator means;

differentiating filter mean connected to the output of said selector means for receiving th selected quantizing value therefrom for quantization noise differentiation to produce an error signal;

arithmetic means disposed between said input means and said differentiating filter means and respectively connected thereto for adding the error signal to the next input signal to be received by said comparator means;

control means for producing a control signal indicative of the desired amplitude of the analog signal to be represented by the encoded-bit digital output signal from said signal modulation system, said control means providing the control signal as an input to said memory means for selecting a predetermined set of threshold values and a predetermined set of quantizing values as stored therein for input to said comparator means and to said selector means respectively; and encoding output means connected to said comparator means for receiving the results of the comparisons provided by said plurality of comparators and producing an encoded-bit data output signal representative of an analog signal with the desired amplitude.

2. A signal modulation system as set forth in claim 1, wherein said memory means comprises a first read-only-memory connected to the output of said control means for receiving a control signal input therefrom and having a plurality of sets of threshold values, each set including a plurality of threshold values stored therein, said first read-only-memory being connected to said comparator mean for providing respective threshold values included in the set of threshold values as selected by the control signal input from said control means for each of the plurality of comparators; and a second read-only-memory having a plurality of sets of quantizing values, each set including a plurality of quantizing values stored therein, said second of quantizing values stored therein, said second rad-only-memory being connected to said control means for receiving the control signal produced thereby as an input for selecting a set of quantizing values as stored therein for input to said selector means.

3. A signal modulation system as set forth in claim 2, wherein said control means includes a read-only-memory address latch circuit for providing a memory address to each of said first and second read-only-memories as the control signal input thereto for selecting the predetermined set of threshold values from said first read-only-memory and the predetermined set of quantizing values from said second read-only-memory.

4. A signal modulation system as set forth in claim 3, wherein said control means further includes a data processor having an output connected to said read-only-memory address latch circuit for providing a control signal to said read-only-memory address latch circuit to be applied to said first and second read-only-memories as the address for the sets of threshold values and quantizing values to be respectively provided thereby.

5. A signal modulation system as set forth in claim 2, wherein the digital input signal is provided as a common digital input signal to each of the plurality of comparators of said comparator means;

said first read-only-memory in response to a control signal from said control means providing a predetermined set of threshold values having various threshold levels, one threshold value being receiving by each of said plurality of comparators for comparison with the common digital input signal as received by each of said plurality of comparators of said comparator means; and each of said plurality of comparators producing a respective comparison flag as the comparison result between the common digital input signal and the particular threshold value received thereby;

the comparison flags of said plurality of comparators being respectively set at logic state "0" when the threshold level of the threshold value of the respective comparator is higher than the value of the digital input signal and being set at logic state "1" when the threshold level of the threshold value of the respective comparator is lower than the value of the digital input signal.

* * * * *